United States Patent [19]

Davis

[11] 3,974,404
[45] Aug. 10, 1976

[54] INTEGRATED CIRCUIT INTERFACE STAGE FOR HIGH NOISE ENVIRONMENT

[75] Inventor: William Folsom Davis, Tempe, Ariz.

[73] Assignee: Motorola, Inc., Chicago, Ill.

[22] Filed: Mar. 26, 1975

[21] Appl. No.: 562,306

Related U.S. Application Data

[63] Continuation of Ser. No. 332,950, Feb. 15, 1973, abandoned.

[52] U.S. Cl. ............................. 307/303; 307/213; 340/52 E; 357/35; 357/44; 357/48
[51] Int. Cl.² ......................................... H01L 27/04
[58] Field of Search ................... 357/35, 44, 48; 307/213, 303

[56] References Cited
UNITED STATES PATENTS

| | | | |
|---|---|---|---|
| 3,411,051 | 11/1968 | Kilby | 357/35 |
| 3,412,460 | 11/1968 | Lin | 357/44 |
| 3,538,449 | 11/1970 | Solomon | 357/44 |
| 3,622,812 | 11/1971 | Crawford | 357/35 |

OTHER PUBLICATIONS

Hibberd, Integrated Circuits (McGraw–Hill, NY, 1969), pp. 79–81.

*Primary Examiner*—William D. Larkins
*Attorney, Agent, or Firm*—Harry M. Weiss; Charles R. Hoffman

[57] ABSTRACT

An interface circuit for integrated circuit devices which prevents deleterious injection of minority carriers into the substrate during overvoltages applied to a terminal of the integrated circuit. A lateral PNP transistor formed in an N-type region has its base connected to a bias circuit and its collector connected to a load circuit and its emitter connected to a current source having a P-type electrode. The emitter is also connected to a first terminal of the integrated circuit. If the first terminal is connected to a signal wire having large negative noise pulses thereon, the emitter-base junction of the lateral PNP transistor will become reverse biased during the negative pulses, thereby preventing the injection of minority carriers into the P-type substrate in which the integrated circuit is fabricated. If the terminal is connected to a second terminal of a second integrated circuit having therein a lateral PNP transistor having its base connected to a control circuit and its collector connected to a load circuit, the first and second lateral PNP transistors and the current source form a differential amplifier, which provides a low impedance to noise impulses applied to the terminals.

6 Claims, 5 Drawing Figures

INTEGRATED CIRCUIT INTERFACE STAGE FOR HIGH NOISE ENVIRONMENT

This is a continuation, of application Ser. No. 332,950, filed Feb. 15, 1973, now abandoned.

BACKGROUND OF THE INVENTION

Integrated circuits may be advantageously utilized in modern automotive electrical systems, for example, in ignition systems or in seat belt interlock systems, affording substantial cost savings. However, the automotive environment has been found to be an exceptionally harsh one for semiconductor circuits in general, and for integrated circuits in particular. As a result, unexpected problems and requirements have arisen in the design of integrated circuits which must perform reliably in automotive electrical systems, and in other high-noise environments. A wide range of temperatures may occur in the automotive environment. Further, a wide range of spurious signals typically occur throughout the wiring of an automotive electrical system. For example, relatively low energy spurious signals of either positive or negative polarity having magnitudes of several hundred volts, hereinafter referred to as "noise" signals, typically occur on wiring lines connecting various sensors to input terminals of integrated circuit devices. Such noise signals may cause malfunctions in the operation of prior art integrated circuit devices, or may even cause destruction of them, and further may destroy discrete semiconductor devices such as power transistors controlled by the integrated circuit. Further, discontinuities in the main power lines of an automotive electrical system, such as interruptions in the connection to the 12 volt automobile battery, may cause severe, high-energy transient voltages, hereinafter called "load dump" voltages, of over 100 volts to occur on the main power lines. The load dump transient voltages may destroy the integrated circuit devices of the prior art in the absence of expensive external protective measures.

Interface circuits of the prior art have had two major shortcomings for utilization in high noise environments. A shortcoming of some prior art interface circuits is that an N-type epitaxial region is directly connected to an input or output terminal of an integrated circuit chip, which input or output terminal may be connected to a long wire which passes through a high noise environment, and thereby has large magnitude noise pulses thereon. If a large negative noise signal occurs on the terminal, the PN junction between the N-type epitaxial region and the P-type substrate is forward biased, and minority carriers (electrons) are injected into the substrate, and in some cases are collected by other nearby reverse biased N-type epitaxial regions. This frequently causes malfunction of the circuit, especially if flip-flop devices or memory devices are on the chip. Another problem typically occuring with prior art interface circuits, including those used in automotive circuits, is that under some conditions a very high impedance appears at the terminal, and a low energy noise signal may develop sufficiently high voltage to cause the circuit to respond to the noise signal as if it were an information signal. This situation is especially likely to occur when external terminals of two integrated circuits are connected together to a long wire in a high noise environment so that an output stage on one chip drives both the input stage to another chip and the long wire. The output transistor of the first chip may be off at some time during the circuit operation causing a high impedance between the long wire and ground. Noise signals may then have sufficient magnitude to cause malfunctions in circuit operation. The present invention solves these two major shortcomings of the prior art interface circuits by providing interface circuitry which prevents injection of minority carriers into the substrate and always presents a low impedance at external terminals during operating conditions.

SUMMARY OF THE INVENTION

In view of the foregoing considerations, it is an object of this invention to provide an interface circuit suitable for integrated circuits in a high-noise environment.

It is a further object of this invention to provide an interface circuit suitable for integrated circuits in automotive electrical systems.

It is yet another object of this invention to provide in an integrated circuit an improved interface circuit which avoids injection of minority carriers into the substrate during operation in an automotive electrical system.

It is yet another object of this invention to provide interface circuitry for integrated circuits which always provides low input impedance to noise signals on an input terminal.

Briefly described, the invention provides an interface circuit in an integrated circuit including a lateral transistor connected to an external terminal, which may be connected to a long signal wire which passes through a high noise environment. In one embodiment of the invention the lateral transistor is a lateral PNP transistor having its emitter connected to the external terminal and also to a current source in the integrated circuit having a P-type electrode, wherein injection of electrons into the substrate of the integrated circuit during negative noise pulses on the long wire connected to the external terminal does not occur.

DESCRIPTION OF THE INVENTION

Figure 1:
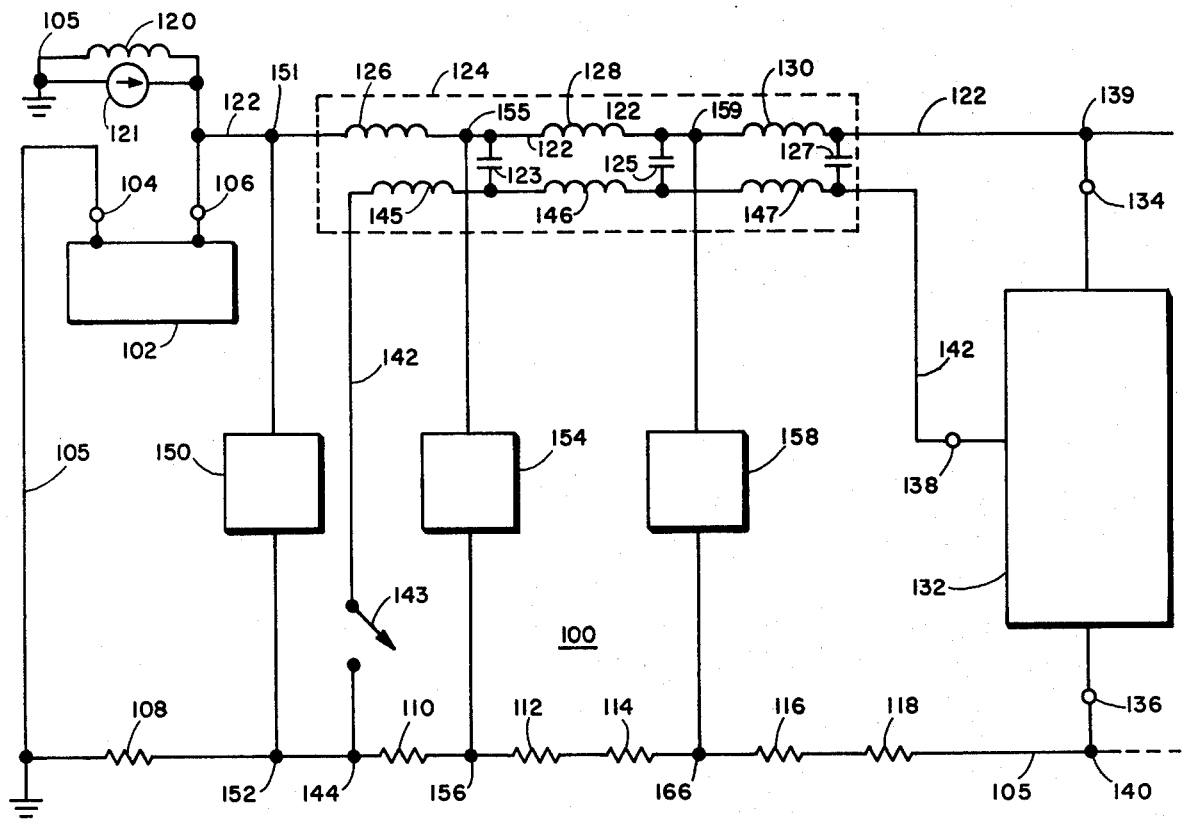
FIG. 1 is a schematic diagram of a model of the automotive electrical environment.

The environment giving rise to the problems solved by the present invention is best described with reference to FIG. 1, which is a schematic model of the automotive electrical environment, and also to FIG. 2, which is a graph illustrating the noise and electrical transients occurring in the automotive electrical system of FIG. 1. In FIG. 1, automotive electrical system 100 includes a 12 volt battery 102, which has a negative terminal 104 and a positive terminal 106. Negative terminal 104 is connected to the electrical ground conductor 105 of the electrical system 100. The electrical ground conductor 105 includes the automobile chassis and wires connected to the chassis at various points thereof. In FIG. 1 the chassis resistance is lumped into several discrete resistors 108, 110, 112, 114, 116 and 118. It is known that these resistances may increase in value as corrosion of the chassis occurs and as mechanical conditions weaken various connections in the chassis as the automobile ages. Positive terminal 106 of battery 102 is connected to alternator field coil 120 and the alternator output, represented by current source 121, the other terminals of which are connected to the system ground. Power line 122, hereinafter referred to as the B+ bus, is also connected to positive terminal 106. B+ bus 122 runs through electrical wiring harness 124, along with numerous other wires of the electrical system. The distributed inductance of B+ bus 122 is lumped into several inductances 126, 128 and 130 in the model of FIG. 1. Integrated circuit 132, which has positive power supply terminal 134, ground supply terminal 136, and input terminal 138 is connected between B+ bus 122 at point 139 thereof and ground conductor 105 at point 140 thereof. Input terminal 138 is connected to wire 142 which runs through wiring harness 124 in close proximity to B+ bus 122 and is connected to switch 143. When switch 143 is closed, wire 142 is connected to ground conductor 105 at point 144 thereof. The distributed inductance of wire 142 is lumped into several inductors 145, 146 and 147. Lumped capacitors 123, 125, and 127 represent the capacitive coupling between B+ bus 127 and signal wire 142. Electrical accessory 150 is connected between point 151 of B+ bus 122 and point 152 of ground conductor 105. Second electrical accessory 154, which may, for example, be an air conditioner motor, is connected between point 155 of B+ bus 122 and point 156 of ground conductor 105. Third electrical accessory 158, which may, for example, be a motor operating an electric seat or electric window, is connected between point 159 of B+ conductor 122 and point 160 of ground conductor 105. The various inductances illustrated in FIG. 1 and the mutual coupling therebetween causes a large amount of electrical noise on wire 142 and B+ bus 122 as various electrical accessories are switched on and off. For example, if accessory 158 is operating, a large current flows from terminal 106 through B+ bus 122, inductors 126 and 128 and through resistors 114, 112, 110 and 108 to negative terminal 104. The resistances in ground conductor 105 are typically of sufficiently large values to cause a substantial drop in the ground voltage between point 160 and negative terminal 104. If accessory 158 is suddenly switched off, the change in current through inductors 126 and 128 causes a very large positive transient voltage to appear on point 159 and, also on point 139. Subsequently, a large positive voltage will appear between terminals 134 and 136 of integrated circuit 132. Further, mutual coupling between inductors 126 and 145 and also between inductors 128 and 146 will cause a large positive transient pulse to appear on wire 142 and hence on terminal 138 of integrated circuit 132, especially if switch 143 is open. Similarly, switching the other electrical accessories 150 and 154 on or off may cause positive or negative transient impulses to appear on B+ bus 122, and on terminal 134, and also on wire 142 and terminal 138. In general, it may be seen that any integrated circuit in the electrical system 100 connected distant from battery 102 between B+ bus 122 and ground conductor 105 will experience transient voltages occurring between terminals 134 and 136 when accessories are switched. It is also seen that there will be an uncertain ground reference voltage, due to currents flowing through the disturbed resistances 108, 110, etc. Further, any input terminals connected to wires which run through the wiring harness 124 will pick up noise due to mutual inductive and capacitive coupling with B+ bus 122. Another type of noise distinct from the positive terminal 106 while current is flowing through field coil 120. In this case, a high energy, positive transient voltage, called the "load dump" voltage, appears on B+ bus 122.

Figure 2:
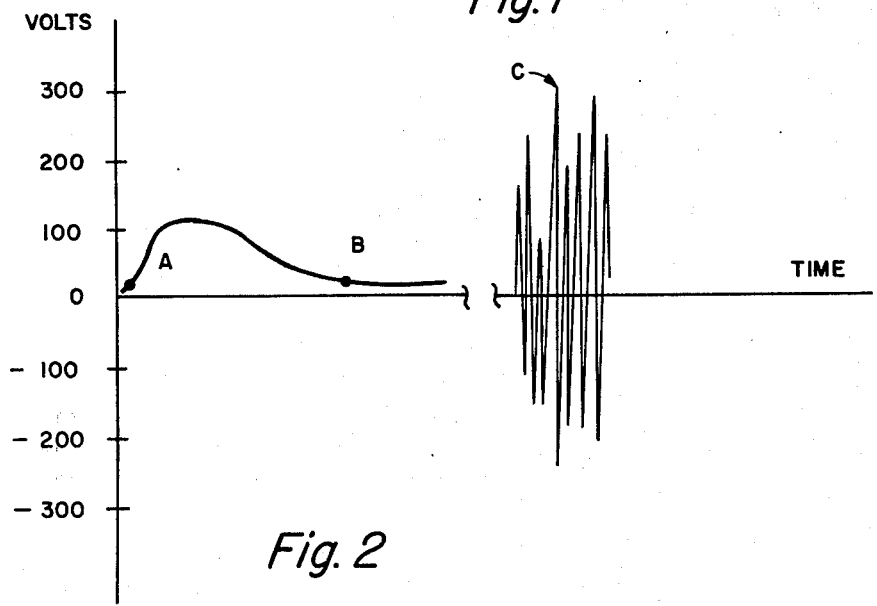
FIG. 2 is a graph illustrating a load dump transient voltage and electrical noise in an automotive electrical system.

Both of the aforementioned types of voltages are illustrated in the graph of FIG. 2. The load dump voltage is illustrated on the lefthand portion of the horizontal axis between points A and B. As seen in FIG. 2, the magnitude of the load dump voltage may exceed 100 volts. The time duration between points A and B is typically half a second. This transient voltage on the B+ bus 122 is of sufficient magnitude and energy to destroy prior art integrated circuit devices and low cost discrete semiconductor components such as zener diodes and power transistors, unless some method is employed to protect the integrated circuit. The waveform C illustrated on righthand portion of the graph in FIG. 2 represents high voltage, high frequency noise which may occur on B+ bus 122 and wire 142. The magnitude of the noise represented by waveform C may exceed 300 volts, and typically has a duration of approximately one to fifty microseconds. These pulses also have energy sufficient to sometimes destroy prior art integrated circuit devices. A spectrum analysis of a noise waveform such as is shown in FIG. 2 further illustrates the presence of very high frequency component signals having magnitudes of several volts and frequencies as high as 100 megahertz. Since bipolar integrated circuits are high frequency circuits, they respond to such high frequency noise readily, and various precautions in the design of circuits for use in the automotive environment must be taken to insure that the circuits respond to information input rather than to such noise. Due to the high currents, which may be many amperes, which may flow through the chassis resistance, substantial voltage drops may occur in the ground conductor giving rise to a situation wherein a switch or sensor is referenced to a different ground voltage than the integrated circuit having an input terminal connected by a long wire to the switch or sensor.

Figure 3:
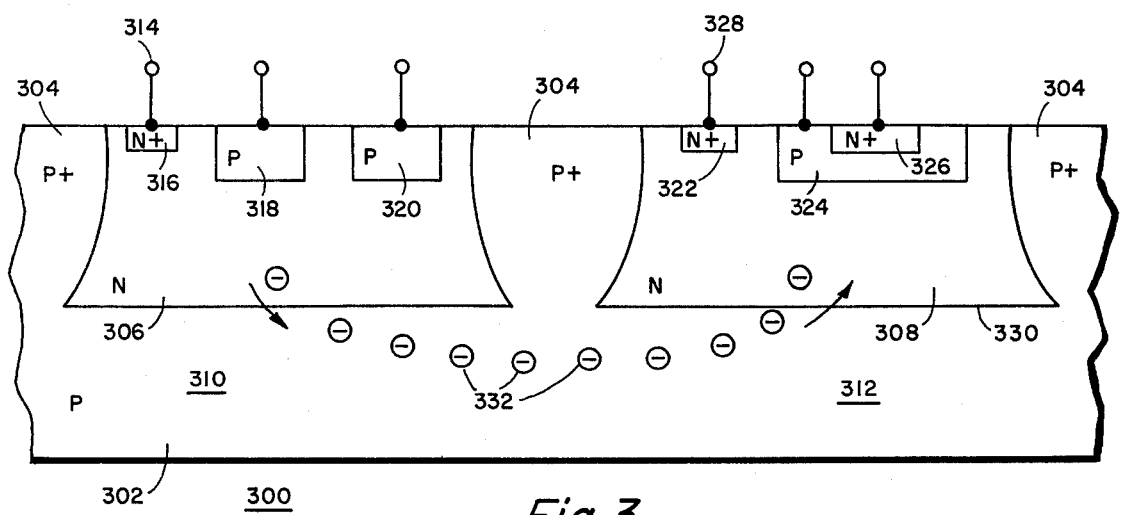
FIG. 3 is a cross sectional diagram illustrating a portion of an interface circuit of the prior art and a portion of a flip-flop, and is useful in explaining the shortcomings of the prior art.

A serious problem results when interface circuits of the prior art having an input or output terminal directly connected to an N-type epitaxial island are utilized in the above-described environment. For example, if the collector of an NPN transistor is connected to an external terminal, which is connected to a long control wire which passes through the above-described high-noise environment, a large negative noise impulse on the wire will cause the PN junction between the substrate and the N-type region to be forward biased, causing injection of electrons into the substrate. This condition is now described in detail, referring to FIG. 3, which is a cross sectional diagram of an integrated circuit having a prior art interface circuit thereon. Referring to FIG. 3, integrated circuit 300 is fabricated on P-type substrate 302, which has a heavily doped P-type isolation region 304 formed therein. Isolation region 304 acts to electrically isolate N-type regions 306 and 308, which are formed from an epitaxial layer on substrate 302. An interface transistor 310 is formed in N-type region 306, and a flip-flop transistor 312 is formed in N-type region 308. For example, transistor 310, which is a lateral PNP transistor, may be the input transistor of a PNP differential amplifier input stage, having its base electrode connected to external terminal 314. Heavily doped N-type contact region 316 is formed within region 306 to provide a base contact region. P-type regions 318 and 320 within region 306 form the emitter and collector of lateral PNP transistor 310. If a sufficiently negative noise signal appears on base terminal 314, then the PN junction between substrate 302 and region 306 will be forward biased, causing injection of minority carrier electrons 332 from region 306 into substrate 302, as indicated by the arrow. If flip-flop transistor 312 is one of the cross coupled switching transistors of a typical bipolar flip-flop device, having N-type contact region 322 and P-type base region 324 formed in region 308, and N-type emitter region 326 formed in region 324, and the flip-flop has a logical 1 stored therein such that collector electrode 328 is at a substantially positive voltage with respect to substrate 302, then PN junction 330 between regions 308 and substrate 302 is reverse biased. Then injected electrons 332 may diffuse in substrate 302, and those which enter the depletion region of PN junction 330 will be swept thereacross by the electric field and are effectively collected by collector region 308. If a sufficient number of injected electrons are collected in this fashion, the logical state of the flip-flop may be reversed, thereby impairing circuit operation.

Figure 4:
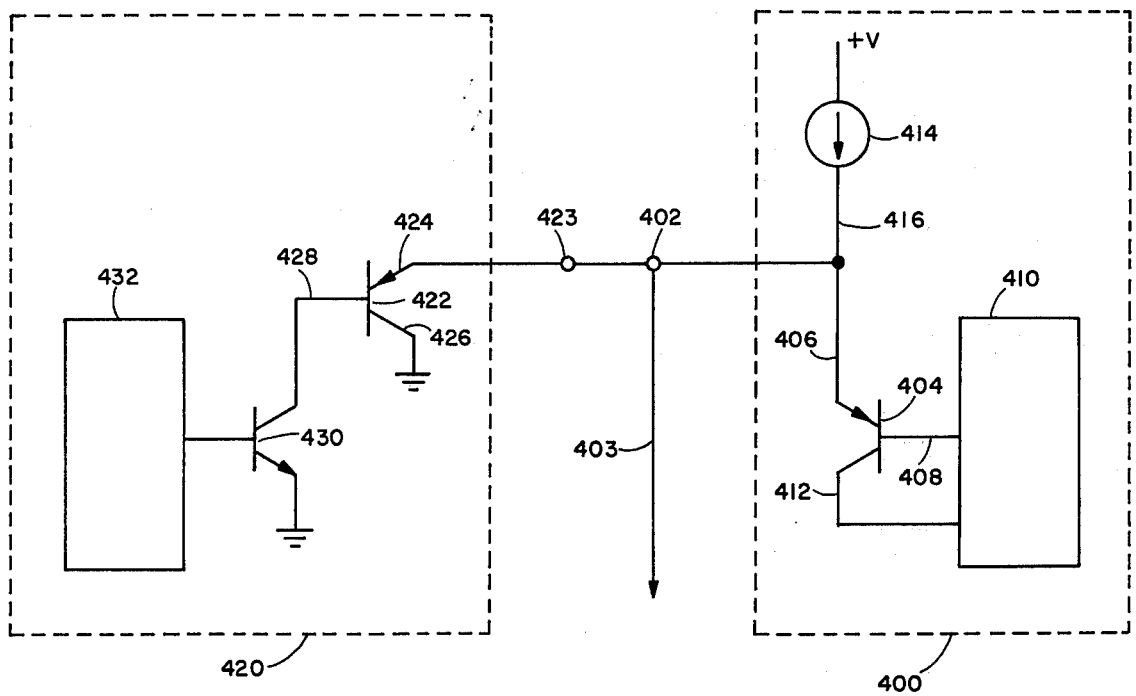
FIG. 4 is a schematic diagram of an embodiment of the invention.

The above described problem does not occur when the interface circuit of this invention, as illustrated in FIG. 4, is utilized.

In FIG. 4, integrated circuit 400 has an external terminal 402, which is connected to long control wire 403. Wire 403 may pass through a high-noise environment, and may, for example, be the same as wire 142 in FIG. 1. Within monolithic integrated circuit 400 (which may be the same as integrated circuit 132 in FIG. 1) is an interface circuit which includes lateral PNP transistor 404. The emitter 406 of transistor 404 is connected to terminal 402.

Base electrode 408 of transistor 404 is connected to circuit 410 which includes circuitry to bias base electrode 408 at a suitable voltage. Collector 412 of transistor 404 is connected to circuit 410, which also includes a load circuit suitable for processing information from terminal 402 and for filtering out high frequency noise thereon. Current source 414 has a P-type electrode 416 which is connected to emitter 406. Thus, a noise pulse on terminal 402 which is substantially more negative than the P-type substrate of integrated circuit 400 will simply reverse bias the emitter-base junction of transistor 404, and the base electrode 408, which is an N-type region within the P-type substrate of integrated circuit 400, will not be caused to inject minority carriers into said substrate. A second integrated circuit 420, also shown in FIG. 4, has an external terminal 423. Within integrated circuit 420 is a lateral PNP transistor 422 having an emitter 424, a collector 426, and an N-type base region 428, base region 428 being an N-type island in the P-type substrate of integrated circuit 420. The emitter 424 is connected to external terminal 423, which is connected to terminal 402. The collector 426 is connected to ground, and the base 428 is connected to NPN transistor 430, which has its emitter connected to its ground and its base connected to circuit 432, which provides a drive signal to transistor 430. When integrated circuit 400 and integrated circuit 420 are externally connected as in FIG. 4, transistors 404 and 422 and current source 414 form a PNP differential amplifier. The connection provides an ideal chip-to-chip interconnection scheme for high noise environment, since large negative transient voltages cannot cause injection of minority carriers into the substrate of either integrated circuit 400 or integrated circuit 420, since the emitter base junctions will be reversed biased. Further, during normal operating conditions one or the other of transistors 404 and 422 will be conducting, presenting a low noise impedance to external terminals 423 and 402. Thus, low energy noise signals will be low in magnitude by virtue of the low impedance, and circuit 410 will not respond to the noise signals, but only to information signals applied to terminal 402.

Since the operating frequency of integrated circuits in typical automotive applications is fairly low, the frequency response of lateral PNP transistors, which is inherently much lower than that of vertical NPN bipolar transistors, is not limiting to the desired circuit performance. However, for most applications in integrated circuits, the use of lateral PNP input transistors is not suitable because of the low frequency response thereof. However, in conjunction with the harsh automotive environment, as described hereinbefore, the interface circuit scheme for interconnecting integrated circuits in the automotive environment solves the problems caused by minority carrier injection into the substrate and avoids circuit misfunction caused by spurious noise signals coupled to the input terminals.

Figure 5:
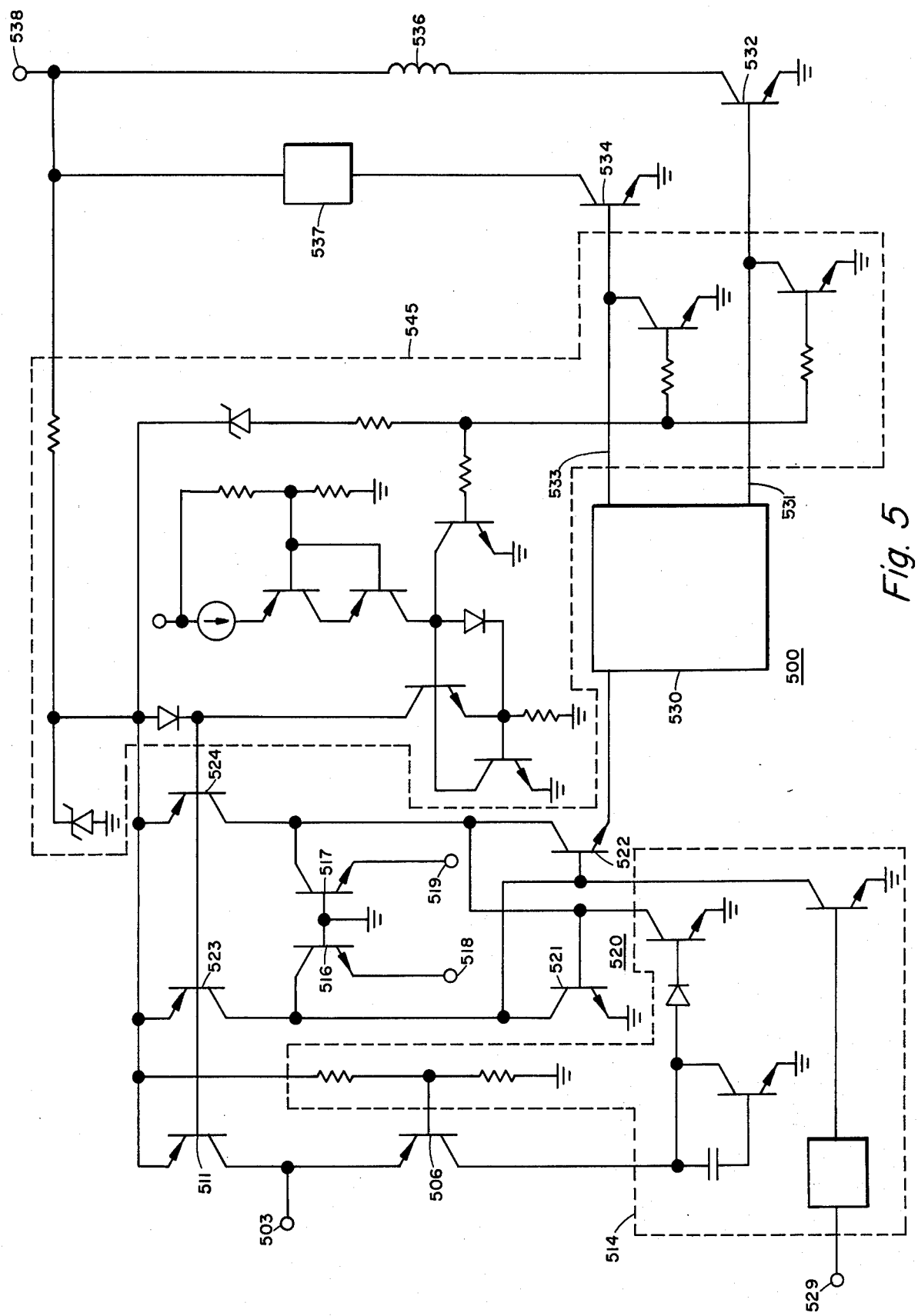
FIG. 5 is a schematic diagram illustrating an embodiment of the invention in an automotive electrical system.

FIG. 5 depicts another embodiment of the invention, wherein integrated circuit 500 (which may be integrated circuit 132 in FIG. 1) has external terminal 503 connected to an interface circuit which includes lateral PNP transistor 506. Transistor 506 has its emitter connected to terminal 503, its base connected to circuit 514, and its collector connected to the collector of lateral PNP transistor 511, which acts as a constant current source. Circuit 514 includes bias circuitry to produce a reference voltage for the base of transistor 506, and further includes a load circuit for the collector of transistor 506, which load circuit produces a signal for controlling flip-flop 520. Circuit 514 is connected to a second external terminal 529, and includes therein circuitry for producing a second signal for controlling flip-flop 520. Flip-flop 520 includes cross-coupled switching NPN transistors 521 and 522 having their bases connected to circuit 514 and their collectors connected, respectively, to the collectors of transistors 523 and 524, which act as load devices. Parasitic lateral NPN transistors 516 and 517 are included in FIG. 5 to illustrate the problem solved by the invention. The bases of parasitic transistors 516 and 517 are the P-type substrate in which integrated circuit 500 is fabricated. Emitters 518 and 519 are any N-type isolated epitaxial regions relatively near the N-type epitaxial regions which are, respectively, the collectors of switching transistors 521 and 522. For example, emitter 518 may be the N-type epitaxial region forming the base of lateral PNP transistor 506. Therefore, if the base of transistor 506 becomes sufficiently more negative than the P-type substrate of integrated circuit 500, (as previously explained with reference to FIG. 3) electrons will be injected into the substrate, turning lateral parasitic transistor 518 on, which possibly incorrectly sets flip-flop 520. However if terminal 503 becomes substantially more negative than the substrate of integrated circuit 500, the emitter-base junction of lateral PNP transistor 506 becomes reverse biased, so that its base, which is also the N-type epitaxial region forming emitter 518, never becomes more negative than the substrate. Therefore, parasitic transistors 518 and 519 are never turned on, and flip-flop 520 operates reliably in the high-noise environment of FIG. 1, wherein terminal 138 in FIG. 1 may be the same as terminal 503 in FIG. 5.

The emitter of transistor 522 is connected to circuit 530, which senses the information stored on flip-flop 20 and converts it to signals to control output transistors 532 and 534. As an example, integrated circuit 500 may be part of an automotive seat belt interlock system, wherein terminal 503 has applied thereto a seat input signal from the automobile driver seat indicating whether or not the driver has his weight on the seat. Terminal 529 may be an input signal from the seat belt indicating whether or not the seat belt is fastened. With no driver in the driver seat of the automobile, and with the seat belt unfastened, both the seat input and the belt input are ungrounded. When the driver puts his weight on the seat, the seat input 503 is grounded, and transistor 506 is turned off. Then, when the seat belt is buckled, the belt input is grounded, causing a 1 to be stored in the flip-flop. If the order of buckling the seat belt and placing the driver's weight on the seat are reversed, a 0 is is written into the flip-flop. The state of the flip-flop is detected through the emitter of transistor 522 by circuit 530, which produces drive current through terminal 531 to turn on output transistor 532 if the seat input 503 and the belt input 529 are properly grounded. If the seat input and belt input are not grounded in the proper sequence, and a 0 is stored, then circuit 350 provides base current only through terminal 533 to output transistor 534. Output transistor 532 enables the starting relay 536 is a 1 is stored in flip-flop 520. On the other hand, output transistor 534 is turned on, thereby activating warning buzzer 537 if a 0 is stored in flip-flop 520.

In summary, the invention described herein provides novel interface circuitry for integrated circuits including a lateral PNP transistor having its emitter connected to an input terminal and also to a P-type electrode of a current source. The integrated circuit is thereby protected against injection of minority carriers into the substrate by negative noise signals which occur when long wires running through high-noise environments are connected to the input terminal. Further, according to the invention, if an output terminal of another integrated circuit having a lateral PNP output transistor thereon, the emitter of the lateral PNP output transistor being connected to the second terminal, is connected to the first terminal, a differential amplifier circuit is formed which presents a low noise impedance to noise signals appearing on the shorted terminals.

Although this invention has been illustrated and described in relation to several specific embodiments thereof, those skilled in the art will readily recognize that variations in placement of parts may be made to suit specific requirements without departing from the spirit and scope of the invention.

What is claimed is:

1. An interface circuit for first and second integrated circuit devices in first and second P-type bodies of semiconductor, respectively, having first and second terminals, respectively, and also having first and second vertical NPN transistors, respectively, each of said vertical NPN transistors having, respectively, an N-type collector region in said respective body of semiconductor at a surface portion thereof, a P-type base region in said respective N-type collector region, and an N-type emitter region in said respective P-type base region, comprising:

a first lateral PNP transistor in said first integrated circuit device, said first lateral PNP transistor having a first base, a first emitter, and a first collector, said first base being a first N-type region in said first body of semiconductor at said first surface portion, said first emitter being a second P-type region in said first N-type region at said first surface portion, said first collector being a third P-type region in said first N-type region at said first surface portion, said first emitter being connected to said first terminal, said first base being connected to a control circuit in said first integrated circuit device, and said first collector being coupled to a collector of said first vertical NPN transistor in said first integrated circuit device;

a lateral PNP current source having an N-type base region in said first body of semiconductor at said first surface portion, a P-type collector region and a P-type emitter region spaced from each other in said N-type base region at said first surface portion, said P-type collector region being connected to said first emitter; and a second lateral PNP transistor in said second integrated circuit device, said second transistor having a second emitter, a second base, and a second collector, said second base being a fourth N-type region and said second body of semiconductor at said second surface portion, said second emitter being a fifth P-type region in said fourth N-type region at said second surface portion, said second collector being a sixth P-type region in said fourth N-type region at said second surface portion, said second emitter being connected to said second terminal, said second terminal being connected to said first terminal, and said second collector being connected to ground conductor means in said second integrated circuit device, and said second base being connected to a collector of an NPN transistor in said second integrated circuit device.

2. An integrated circuit device formed in a region of semiconductor of a first conductivity type including a terminal, said terminal not being a power supply terminal, a vertical transistor including a first base region, a first emitter region, and a first collector region, said first collector region being a first region of a second conductivity type in said region of semiconductor at a surface portion thereof, said first base region being a second region of said first conductivity type in said first region at said surface portion, said first emitter region being a third region of said second conductivity type in said second region at said surface portion comprising:

lateral transistor means in said region of semiconductor at said surface portion for preventing injection of minority carriers into said region of semiconductor, said lateral transistor means having a second base region, a second emitter region, and a second collector region, said second emitter region being connected to said terminal, said second base region being a fourth region of said second conductivity type in said region of semiconductor at said surface portion, said second collector region being a fifth region of said first conductivity type in said fourth region at said surface portion, said second emitter region being a sixth region of said first conductivity type in said fourth region at said surface portion spaced from said second collector region; and a current source connected to said second emitter region, said second collector region and said second base region being connected to a control circuit in said integrated circuit, wherein said current source is a second lateral PNP transistor having a collector connected to said first emitter of said lateral transistor means.

3. The integrated circuit as recited in claim 2 wherein said terminal is connected to a wire which passes through a high-noise environment.

4. The integrated circuit as recited in claim 2 wherein said first conductivity type is P-type and said second conductivity type is N-type.

5. An integrated circuit in a region of semiconductor of a first conductivity type at a surface portion thereof, comprising:

an input conductor subject to conduction of noise pulses;

lateral transistor means in said region of semiconductor at said surface portion coupled to said input conductor for preventing injection of minority carriers into said region of semiconductor as a result of said noise pulses, said lateral transistor means having a first base region, a first emitter region, and a first collector region, said first base region being a first region of a second conductivity type in said region of semiconductor at said surface portion, said first collector region being a second region of said first conductivity type in said first region at said surface portion, said first emitter region being a third region of said first conductivity type in said first region at said surface portion spaced from said first collector region, said first emitter region being connected to said input conductor;

bias circuit means connected to said first base region for establishing a bias voltage on said first base region;

load circuit means coupled to said first collector region;

a vertical transistor in said load circuit means, said vertical transistor having a second collector region coupled to said first collector region, a second base region connected to control circuitry in said integrated circuit, and a second emitter region connected to said control circuitry, said second collector being a fourth region of said second conductivity type in said region of semiconductor at said surface portion, said second base region being a fifth region of said first conductivity type in said fourth region at said surface portion, said second emitter region being a sixth region of said second conductivity type at said surface portion; and a current source connected to said first emitter region, wherein said current source is a second lateral PNP transistor having a collector connected to said first emitter of said lateral transistor means.

6. An integrated circuit device formed in a region of semiconductor of a first conductivity type comprising:

input terminal means for receiving an externally applied input signal, said input terminal means not being a power supply terminal;

a vertical transistor including a first base region, a first emitter region, and a first collector region, said first collector region being a first region of a second conductivity type in said region of semiconductor at a surface portion thereof, said first base region being a second region of said first conductivity type in said first region at said surface portion, said first emitter region being a third region of said second conductivity type in said second region at said surface portion;

lateral input transistor means in said region of semiconductor as said surface portion for preventing injection of minority carriers into said region of semiconductor in response to noise signals externally applied to said input terminal means, said lateral input transistor means having a second base region, a second emitter region, and a second collector region, said second emitter region being coupled to said input terminal means, said second base region being a fourth region of said second conductivity type in said region of semiconductor at said surface portion, said second collector region being a fifth region of said first conductivity type in said fourth region at said surface portion, said second emitter region being a sixth region of said first conductivity type in said fourth region at said surface portion spaced from said second collector region, said second collector region and said second base region being connected to a control circuit in said integrated circuit; and constant current source means coupled to said second emitter region for supplying a substantially constant amount of current to the node at which said input terminal means and said second emitter region are connected.

* * * * *